US012690130B2

(12) United States Patent
Ishizaki

(10) Patent No.: US 12,690,130 B2
(45) Date of Patent: Jul. 21, 2026

(54) SEMICONDUCTOR STORAGE DEVICE

(71) Applicant: Kioxia Corporation, Tokyo (JP)

(72) Inventor: Kiyokazu Ishizaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 226 days.

(21) Appl. No.: 18/588,633

(22) Filed: Feb. 27, 2024

(65) Prior Publication Data

US 2024/0314929 A1　　Sep. 19, 2024

(30) Foreign Application Priority Data

Mar. 1, 2023　(JP) ................................. 2023-030874

(51) Int. Cl.
| | |
|---|---|
| *H05K 1/11* | (2006.01) |
| *H05K 1/181* | (2026.01) |
| *H10W 74/10* | (2026.01) |
| *H10W 90/00* | (2026.01) |
| *H10W 90/20* | (2026.01) |
| *H10W 90/24* | (2026.01) |

(52) U.S. Cl.
CPC .............. *H05K 1/117* (2013.01); *H05K 1/111* (2013.01); *H05K 1/181* (2013.01); *H10W 74/117* (2026.01); *H10W 90/00* (2026.01); *H10W 90/701* (2026.01); *H05K 2201/0939* (2013.01); *H05K 2201/09409* (2013.01); *H05K 2201/10734* (2013.01); *H05K 2201/10984* (2013.01); *H10W 90/24* (2026.01); *H10W 90/291* (2026.01); *H10W 90/752* (2026.01)

(58) Field of Classification Search
CPC .... H05K 1/11; H05K 1/117–118; H05K 1/18; H05K 1/181; H05K 2201/0939; H05K 2201/09409; H05K 2201/10734; H05K 2201/10984; H10W 90/00; H10W 90/701; H10W 90/24; H10W 90/291; H10W 90/752; H10W 90/754; H10W 74/117
USPC ......... 361/760–774, 790–795; 174/259–264; 257/734–738
See application file for complete search history.

(56) References Cited

U.S. PATENT DOCUMENTS

| | | | | |
|---|---|---|---|---|
| 8,258,617 | B2 * | 9/2012 | Shibuya ............... | H05K 3/3452 257/784 |
| 8,659,172 | B2 * | 2/2014 | Pendse ................ | H10W 20/063 257/737 |
| 11,569,155 | B2 * | 1/2023 | Liao ..................... | H05K 3/3452 |
| 2003/0146504 | A1 | 8/2003 | Yamane | |
| 2004/0075177 | A1 | 4/2004 | Hanaoka | |

(Continued)

*Primary Examiner* — Tuan T Dinh
(74) *Attorney, Agent, or Firm* — Maier & Maier, PLLC

(57) ABSTRACT

A semiconductor storage device includes a wiring pattern on an insulating base material; an insulating film covering partially the wiring pattern; and an electronic component. The wiring pattern includes a first pad having an edge in an arc shape, and a first wire. The insulating film has a first opening larger than the first pad. The first wire has a first portion, a second portion, and a third portion. The first portion is connected to the first pad inside the first opening extends in a first direction. The second portion is connected to the first pad inside the first opening and extends in a second direction. The third portion is connected to the first portion and the second portion. The first wire is connected with the first pad in an angular range of not more than 90 degrees in a circumferential direction of the first pad.

10 Claims, 12 Drawing Sheets

(56)     References Cited

U.S. PATENT DOCUMENTS

2006/0131758 A1*  6/2006  Dao ................... H10W 90/701
                                                    257/779
2007/0253148 A1*  11/2007  Ishizaki ................ H05K 1/111
                                                    361/600
2008/0093749 A1*  4/2008  Gerber .................. H05K 1/111
                                                    257/784
2014/0252610 A1*  9/2014  Chen .................. H10W 42/121
                                                    257/738
2015/0068791 A1     3/2015  Nakamura
2016/0372412 A1   12/2016  Choi et al.
2018/0063952 A1     3/2018  Noguchi et al.

* cited by examiner

FIG. 3

SEMICONDUCTOR STORAGE DEVICE

CROSS-REFERENCE TO RELATED APPLICATIONS

This application is based upon and claims the benefit of priority from Japanese Patent Application No. 2023-030874, filed Mar. 1, 2023, the entire contents of which are incorporated herein by reference.

BACKGROUND

Technical Field

Embodiments described herein relate generally to a semiconductor device.

Related Art

Semiconductor storage devices include a printed circuit board and electronic components mounted on the printed circuit board. Solder joints on the electronic components are connected to pads on the printed circuit board.

BRIEF DESCRIPTION OF THE DRAWINGS

FIG. 3 is a cross-sectional view showing a part of a board unit according to the first embodiment.

DETAILED DESCRIPTION OF THE INVENTION

Figure 1:
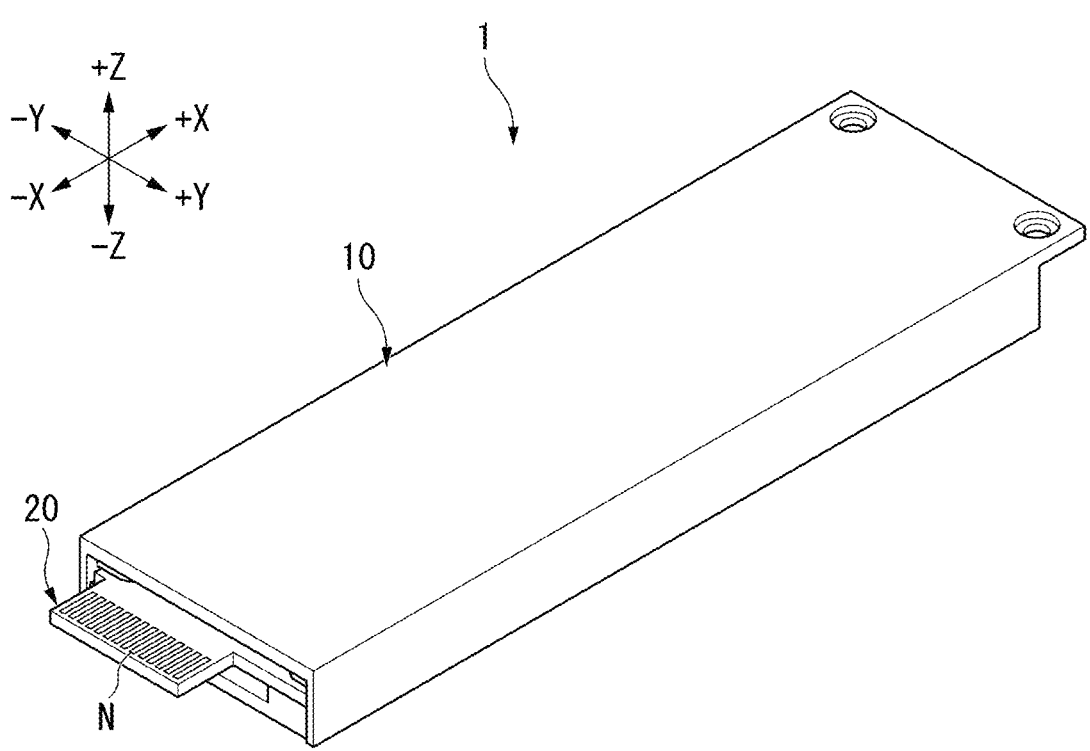
FIG. 1 is a perspective view showing a semiconductor storage device according to a first embodiment.

Hereinafter, semiconductor storage devices according to embodiments will be described with reference to the drawings. In the following description, components having the same or similar functions are denoted by the same reference numerals. Further, redundant descriptions thereof may be omitted.

In this application, terms are defined as follows. "Parallel," "orthogonal," or "the same" may include "substantially parallel," "substantially orthogonal," or "substantially the same," respectively. "Connection" is not limited to mechanical connection, and includes electrical connection. In other words, "connection" is not limited to a case in which two elements to be connected are directly connected, and also includes a case in which two elements to be connected are connected with another element interposed therebetween.

A +X direction, a −X direction, a +Y direction, a −Y direction, a +Z direction, and a −Z direction are defined as follows. The +X direction, −X direction, +Y direction, and −Y direction are directions parallel to a first surface 21a of a board 21 which will be described below (refer to FIG. 2). The +X direction is a direction from a first end portion 21e1 to a second end portion 21e2 of the board 21 (refer to FIG. 2) which will be described below. The −X direction is a direction opposite to the +X direction. When the +X direction and the −X direction are not distinguished, they are simply referred to as an "X direction." The +Y direction and the −Y direction are directions that intersect (for example, are orthogonal to) the X direction. The +Y direction is a direction from a third end portion 21e3 to a fourth end portion 21e4 of the board 21 (refer to FIG. 2). The −Y direction is a direction opposite to the +Y direction. When the +Y direction and the −Y direction are not distinguished, they are simply referred to as a "Y direction." The +Z direction and the −Z direction are directions that intersect (for example, perpendicular to) the X direction and the Y direction, and are a thickness direction of the board 21. The +Z direction is a direction from a second surface 21b to the first surface 21a of the board 21 (refer to FIG. 2) which will be described below. The −Z direction is a direction opposite to the +Z direction. When the +Z direction and the −Z direction are not distinguished, they are simply referred to as a "Z direction."

In general, according to at least one embodiment, a semiconductor storage device comprises an insulating base material, a wiring pattern, an insulating film, and an electronic component. The wiring pattern is on the insulating base material. The insulating film is on the insulating base material and covers a part of the wiring pattern. The electronic component is electrically connected to the wiring pattern. The wiring pattern includes a first pad having an edge formed in an arc shape, and a first wire. The insulating film has a first opening larger than the first pad. The first wire has a first portion, a second portion, and a third portion. The first portion being connected to the first pad inside the first opening and the first portion extending in a first direction. The second portion being connected to the first pad inside the first opening and the second portion extending in a second direction, the second portion has a first distance from the first portion and a second distance from the first pad. The first distance increases as the second distance increases. The third portion being in a side opposite to the first pad with respect to the first portion and the second portion. The third portion being connected to the first portion and the second portion. The first wire is connected with the first pad in an angular range of not more than 90 degrees in a circumferential direction of the first pad.

Figure 4:
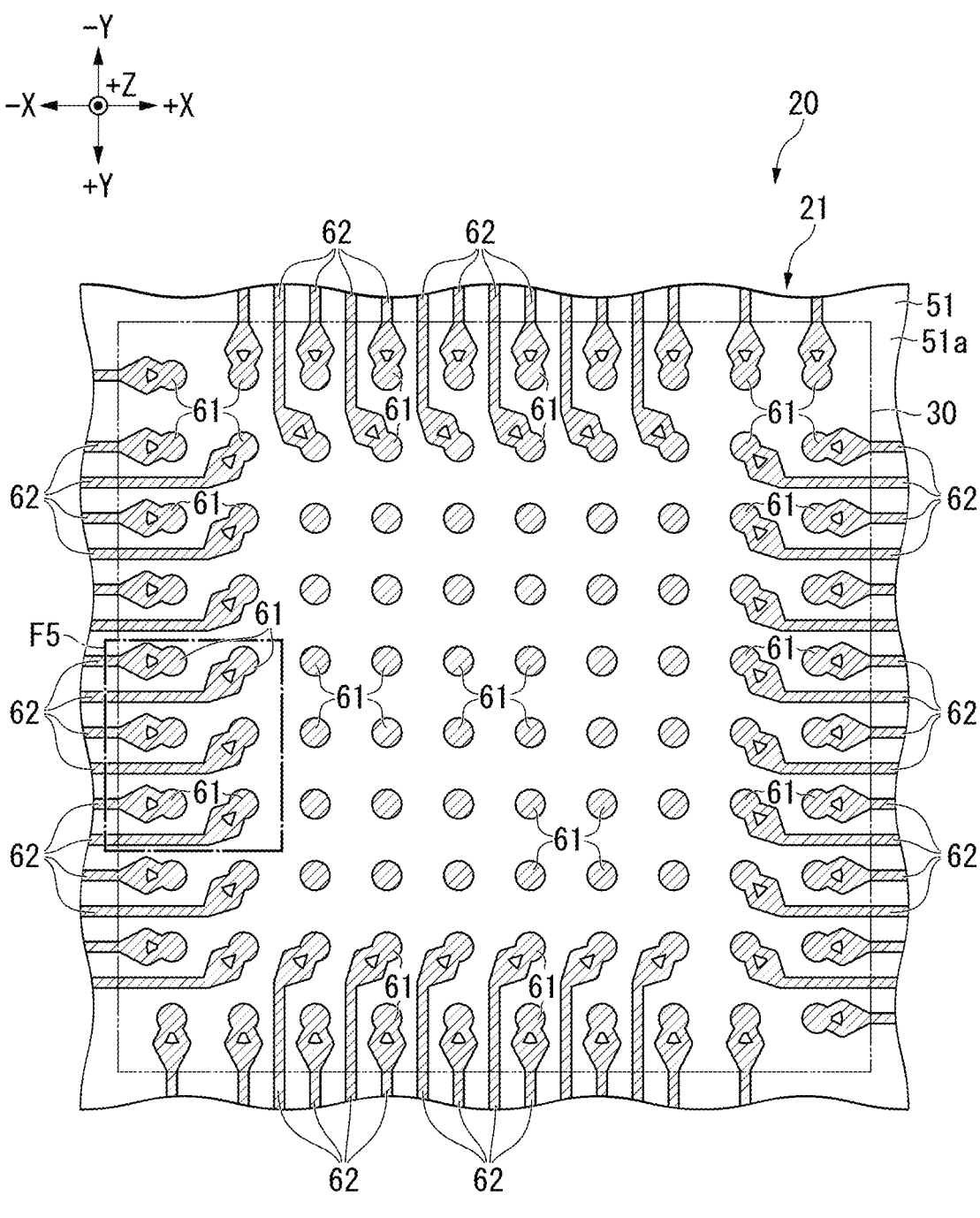
FIG. 4 is a plan view for describing a wiring structure of a wiring pattern according to the first embodiment.

In some embodiments, a semiconductor device includes a plurality of sets of first and second conductive patterns, for example, wiring patterns which are positioned adjacent to each other and spatially separated from each from, as shown in FIG. 4. The first and second conductive patterns, for example, wiring patterns are aligned alternately. The first and second conductive patterns, for example, wiring patterns extend in general in a first direction parallel to the surface of the board of the semiconductor device. The first conductor includes a first wire portion, a first pad portion and a first connecting portion. The second conductor includes a second wire portion, a second pad portion and a second connecting portion. The first and second pad portions are aligned in general in the first direction. The first and second wire portions extend in parallel to each other and in the first direction. The first and second wire portions are adjacent to each other. The first and second wire portions are spatially separated from each from in a second direction perpendicular to the first direction. The first wire portion and the first connecting portion are positioned between two adjacent second wire portions of the second conductive patterns, for example, wiring patterns which are adjacent to each other. The second wire portion and the second connecting portion are positioned more inside than the first wire portion and the first connecting portion. The first connecting portion is wider in width than the first wire portion. The second connecting portion is wider in width than the second wire portion. The first connecting portion has a first plurality of branched contact portions which are in contact directly with and are adjacent to parts of the circumferential edge of the first pad portion. The second connecting portion has a second plurality of branched contact portions which are in contact directly with and are adjacent to parts of the circumferential edge of the second pad portion.

The first wire portion extends in general along the first direction. The first connecting portion is positioned between the first wire and the first pad. The first connecting portion connects the first wire portion and the first pad portion. The first connecting portion is wider in width than the first wire portion. The first connecting portion has a first plurality of branched contact portions which are in contact directly with and are adjacent to parts of the circumferential edge of the first pad portion. The first plurality of branched contact portions extend in different directions from each other. In other words, the first plurality of branched contact portions have respective center lines which extend in the different directions from each other In case that the first plurality of branched contact portions are two branched contact portions, then the two branched contact portions are distant from each other in the circumferential direction of the first pad. The two branched contact portions are spatially separated from each other in the circumferential direction of the first pad. Each of the two branched contact portions has both side edges which extend in parallel to its virtual center line. Thus, the both side edges of a first one of the two branched contact portions extend in a different direction from the both side edges of a second one of the two branched contact portions. This difference in the direction of the branched contact portions will cause a relaxation or a dispersion of a stress. Such stress may be caused between the pads of the board and joints of electronic components with the pads, by mechanical expansion and contraction due to temperature difference in a usage environment and a vibration impact. In addition, the first connecting portion is wider in width than the first wire portion but the width of the first connecting portion is limited so that the first connecting portion is spatially separated from the adjacent second wire portions. The two branched contact portions extend in different directions which are different by a particular angle, which is not more than 90 degrees. In other words, the two branched contact portions have respective virtual center lines extending in different directions which are different by a particular angle, which is not more than 90 degrees. Therefore, the width of the first connecting portion is limited and that the first connecting portion is spatially separated from the adjacent second wire portions. The wider angle will cause more relaxation or dispersion of the stress. The narrower angle will let denser the alternative alignments of the first and second wire portions. The particular angle, which is not more than 90 degrees, can be in terms of those two conflicting requirements.

First Embodiment

1. Overall Configuration of Semiconductor Storage Device

A semiconductor storage device 1 according to a first embodiment will be described with reference to FIGS. 1 to 5.

FIG. 1 is a perspective view showing the semiconductor storage device 1 according to the first embodiment. The semiconductor storage device 1 is, for example, a storage device such as a solid state drive (SSD). The semiconductor storage device 1 is mounted in an information processing device such as a server or a personal computer, and is used as a memory region of the information processing device. In this application, the information processing device in which the semiconductor storage device 1 is mounted is referred to as a "host device."

Figure 2:
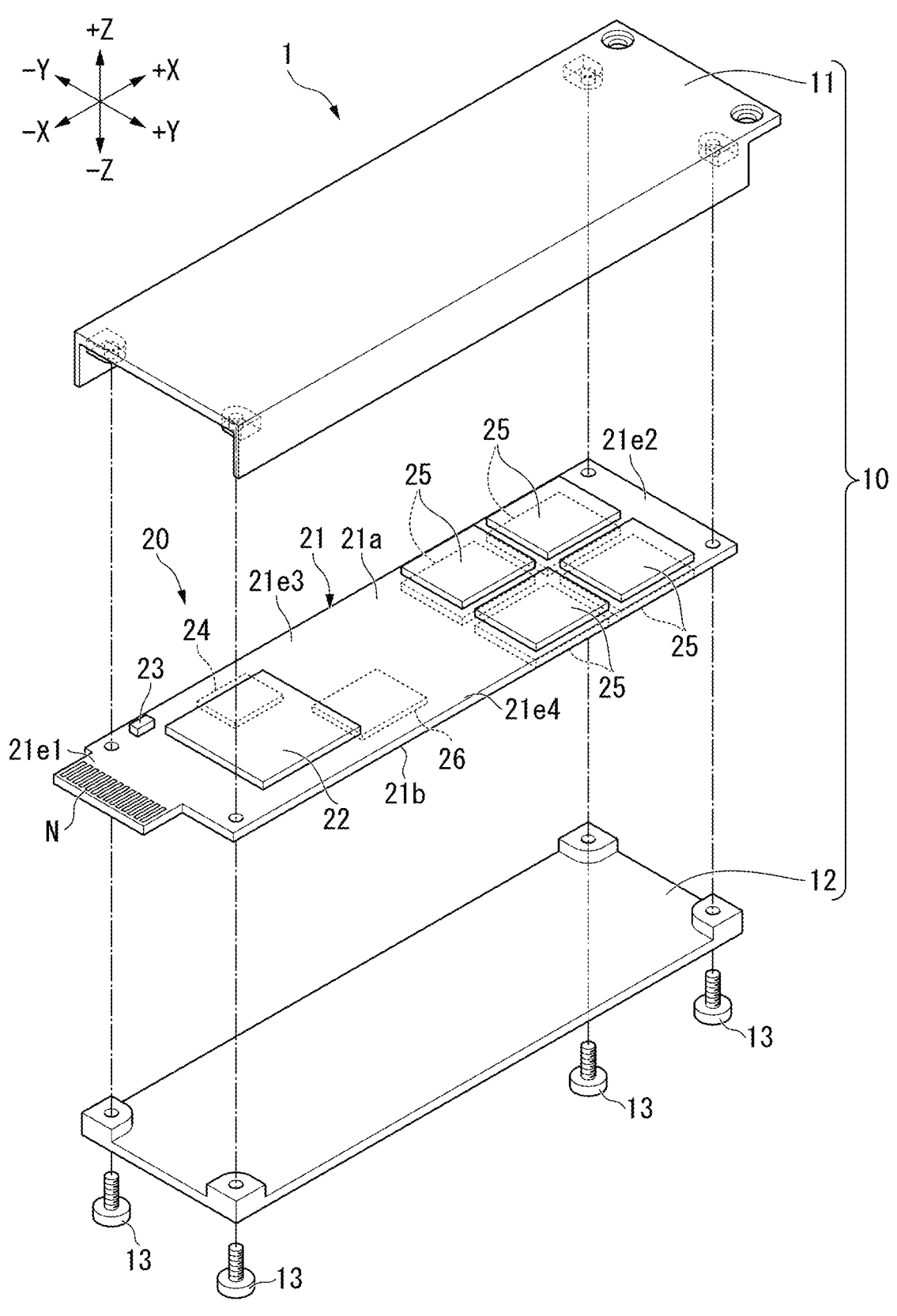
FIG. 2 is a partially exploded perspective view of the semiconductor storage device according to the first embodiment.

FIG. 2 is a partially exploded perspective view of the semiconductor storage device 1. The semiconductor storage device 1 includes, for example, a housing 10 and a board unit 20.

<1.1 Housing>

The housing 10 is a member that forms an outer shell of the semiconductor storage device 1. The housing 10 includes, for example, a first member 11, a second member 12, and a plurality of fixing members 13. The first member 11 includes, for example, a wall portion located on the +Z direction side with respect to the board unit 20, a wall portion located on the +Y direction side with respect to the board unit 20, and a wall portion located on the −Y direction side with respect to the board unit 20. The second member 12 includes a wall portion located on the −Z direction side with respect to the board unit 20. The fixing member 13 is a member that connects the first member 11 and the second member 12 with each other. The fixing member 13 is, for example, a screw. In this embodiment, the housing 10 is formed by connecting the first member 11 and the second member 12 by the plurality of fixing members 13. The housing 10 may be omitted. In this case, the board unit 20 corresponds to an example of the "semiconductor storage device."

<1.2 Board Unit>

The board unit 20 is an assembly on which components including a circuit are mounted. At least a portion of the board unit 20 is accommodated in the housing 10. The board unit 20 includes, for example, a board 21, a controller 22, a power conversion component 23, a power supply circuit component 24, a plurality of NAND memories 25, and a dynamic random access memory (DRAM) 26.

The board 21 is a printed wiring board. The board 21 has a plate shape that extends in the X direction and the Y direction. The board 21 has the first surface 21*a* and the second surface 21*b*. The first surface 21*a* is a surface facing in the +Z direction. The second surface 21*b* is a surface located on the side opposite to the first surface 21*a* and facing in the −Z direction.

The board 21 has the first end portion 21*e*1 and the second end portion 21*e*2 located on the side opposite to the first end portion 21*e*1 as both end portions in a longitudinal direction (the X direction) of the board 21. The first end portion 21*e*1 of the board 21 has a connector N. The connector N is an electrical connection part connectable to the host device.

Further, the board 21 has a third end portion 21e3 and a fourth end portion 21e4 located on the side opposite to the third end portion 21e3 as both end portions of the board 21 in a transverse direction (the Y direction).

The controller 22 is a control component mounted on the board 21. The controller 22 comprehensively controls the entire semiconductor storage device 1. The controller 22 is a semiconductor package including, for example, a system on a chip (SoC) in which a host interface circuit that communicates with the host device, a control circuit that controls the plurality of NAND memories 25, a control circuit that controls the DRAM 26, and the like are integrated into one semiconductor chip. The controller 22 controls, for example, writing, reading, or erasing of data in the NAND memory 25.

The power conversion component 23 is a component that converts power. The power conversion component 23 is, for example, a DC-DC converter. The power conversion component 23 converts power supplied from the host device via the connector N into desired power. The power conversion component 23 outputs the converted power to the power supply circuit component 24.

The power supply circuit component 24 is a component that performs power management. The power supply circuit component 24 is, for example, a power management IC (PMIC). The power supply circuit component 24 supplies power to each of the components (the controller 22, the NAND memory 25, the DRAM 26, and the like) included in the board unit 20.

The NAND memory 25 is a semiconductor package which includes a semiconductor memory chip that stores data in a non-volatile manner. The NAND memory 25 is, for example, a NAND flash memory. As shown in FIG. 2, the plurality of NAND memories 25 are mounted separately on the first surface 21a and the second surface 21b of the board 21. The NAND memory 25 is an example of a "semiconductor memory." However, the "semiconductor memory" is not limited to the NAND flash memory, and may be other types of memory such as NOR memory, magnetoresistive random access memory (MRAM), and resistance change memory.

The DRAM 26 is a semiconductor package which includes a semiconductor memory chip that stores data in a volatile manner. The DRAM 26 is used as a data buffer in which write data received from the host device, read data read from one or more NAND memories 25, and the like are temporarily stored.

2. Mounting Structure of Electronic Components

Next, a mounting structure of electronic components will be described. In the following description, the controller 22, the NAND memory 25, and the DRAM 26 will be referred to as electronic components 30 unless they are distinguished from each other. That is, each of the controller 22, the NAND memory 25, and the DRAM 26 is an example of the electronic component 30. However, the electronic component 30 is not limited to the above example, and may be other types of semiconductor memory or electronic components other than the semiconductor memory.

2.1 Configuration of Electronic Components

Next, a configuration of the electronic component 30 will be described.

Figure 3:
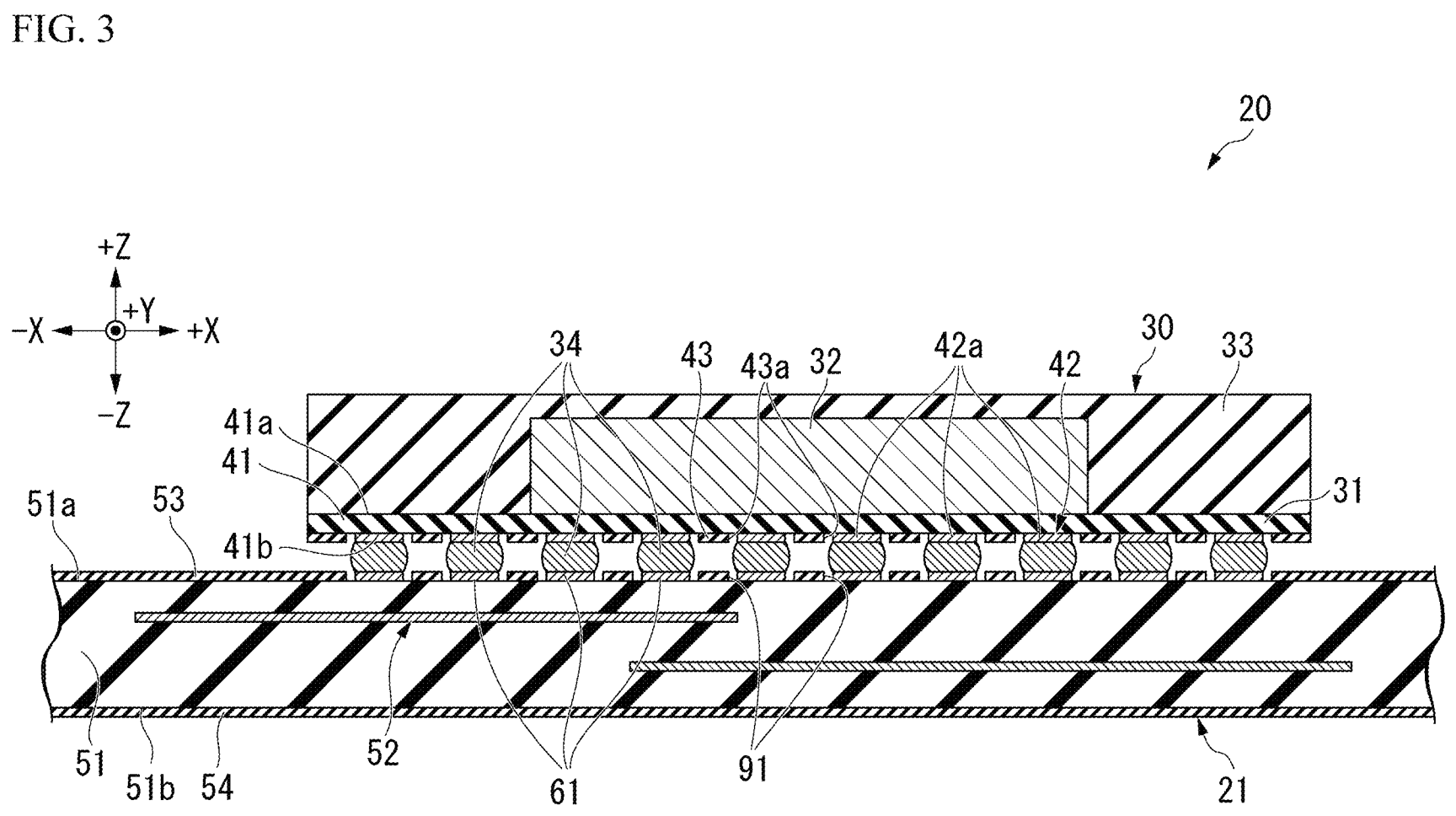

FIG. 3 is a cross-sectional view showing a part of the board unit 20. The electronic component 30 includes a package board 31, a circuit chip 32, a sealing resin part 33, and a plurality of joints 34.

The package board 31 is a board that serves as a base for the electronic component 30. The package board 31 is a printed wiring board. The package board 31 has a plate shape in the X direction and the Y direction. The package board 31 includes, for example, an insulating base material 41, a wiring pattern 42, and an insulating film 43.

The insulating base material 41 is made of an insulator such as a glass epoxy resin. The insulating base material 41 has a first surface 41a and a second surface 41b. The first surface 41a is a surface facing in the +Z direction. The second surface 41b is a surface located on the side opposite to the first surface 41a and facing in the −Z direction.

The wiring pattern 42 is a conductor pattern provided on an inner layer and an outer layer (a front surface layer) of the insulating base material 41. The wiring pattern 42 includes a plurality of pads 42a provided on the second surface 41b of the insulating base material 41. The plurality of pads 42a are arranged in a grid pattern so as to correspond to arrangement positions of the plurality of joints 34.

The insulating film 43 is a solder resist film provided on the second surface 41b of the insulating base material 41. The insulating film 43 has a plurality of openings 43a that expose the plurality of pads 42a, and covers a region outside the plurality of pads 42a.

The circuit chip 32 is provided on the first surface 41a of the insulating base material 41. The circuit chip 32 includes, for example, an integrated circuit.

The sealing resin part 33 is a sealing part that covers the circuit chip 32. The sealing resin part 33 is, for example, a molded resin part and has insulation properties.

The plurality of joints 34 are electrical connection terminals exposed to the outside of the electronic component 30. The plurality of joints 34 are provided on the plurality of pads 42a. The plurality of joints 34 are arranged in a grid pattern in the X direction and the Y direction. The plurality of joints 34 are joints (for example, solder joints) formed of a conductive material such as solder. The plurality of joints 34 are, for example, solder balls. The electronic component 30 is, for example, a ball grid array (BGA) type package component. However, the joints 34 are not limited to the solder balls. The electronic component 30 is electrically connected to a wiring pattern 52 of the board 21, which will be described below, via the plurality of joints 34.

2.2 Configuration of Board

Next, a configuration of the board 21 will be described.

As shown in FIG. 3, the board 21 includes, for example, an insulating base material 51, the wiring pattern 52, a first insulating film 53, and a second insulating film 54.

The insulating base material 51 is made of an insulator such as a glass epoxy resin. The insulating base material 51 has a first surface 51a and a second surface 51b. The first surface 51a is a surface facing in the +Z direction. The second surface 51b is a surface located on the side opposite to the first surface 51a and facing in the −Z direction.

The wiring pattern 52 is a conductor pattern provided on an inner layer and an outer layer (a front surface layer) of the insulating base material 51. The wiring pattern 52 includes a plurality of pads 61 provided on the first surface 51a of the insulating base material 51. The plurality of pads 61 are arranged in a grid pattern so as to correspond to arrangement positions of the plurality of joints 34 of the electronic component 30.

The first insulating film 53 is a solder resist film provided on the first surface 51a of the insulating base material 51 and covers a part of the wiring pattern 52. The first insulating film 53 has a plurality of openings 91 provided corresponding to the plurality of pads 61, and exposes the plurality of pads 61 to the outside of the board 21. A center of each of the openings 91 coincides with a center of each of the pads 61. The second insulating film 54 is a solder resist film provided on the second surface 51b of the insulating base material 51, and covers another part of the wiring pattern 52.

2.3 Wiring Structure

Next, a wiring structure of the wiring pattern 52 will be described.

FIG. 4 is a plan view for describing the wiring structure of the wiring pattern 52. In FIG. 4, for convenience of description, illustration of the first insulating film 53 is omitted, and the wiring pattern 52 is hatched. Further, in FIG. 4, only a part of the wiring included in the wiring pattern 52 is shown.

In this embodiment, the wiring pattern 52 includes a plurality of wires 62. The two or more wires 62 included in the plurality of wires 62 extend from the pads 61 in the X direction (the longitudinal direction of the board 21). Further, two or more other wires 62 included in the plurality of wires 62 extend from the pads 61 in the Y direction (the transverse direction of the board 21).

2.4 Dimension Example

Next, an example of dimensions regarding the board 21 will be described. In this embodiment, a distance between the centers of the plurality of pads 61 is 0.65 mm. A diameter of each of the pads 61 is 0.28 mm. A diameter of the opening 91 is 0.38 mm. A width of the wire 62 is 0.085 mm. A distance between centers of the plurality of wires 62 arranged in parallel is 0.325 mm. However, the dimensions regarding the board 21 are not limited to the above examples, and various dimensions may be adopted.

3. Reinforcement Structure

Next, a reinforcement structure for the joint portion between the board 21 and the electronic component 30 will be described.

Figure 5:
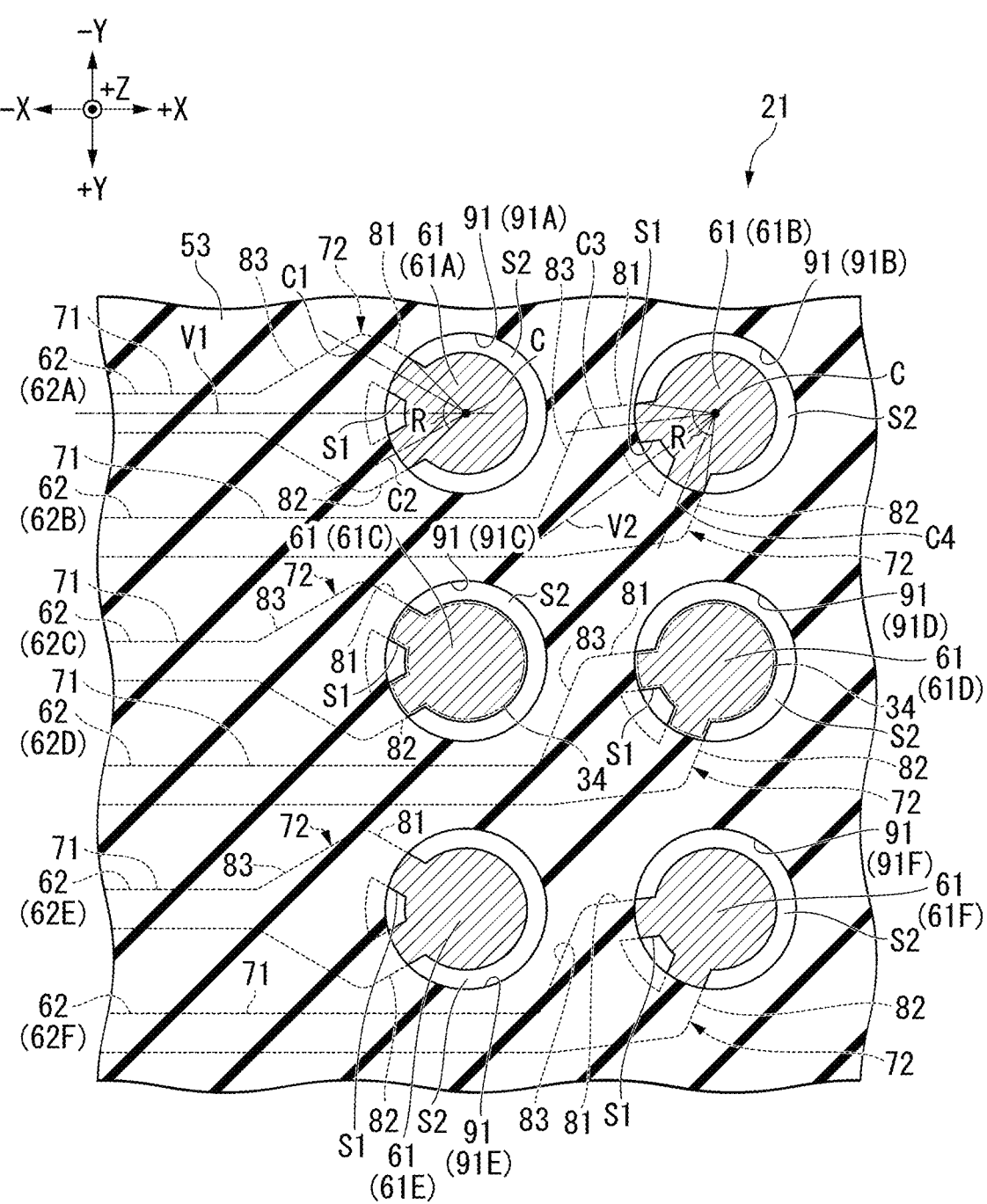
FIG. 5 is an enlarged sectional view showing a region surrounded by line F5 shown in FIG. 4.

FIG. 5 is an enlarged cross-sectional view of a region surrounded by line F5 shown in FIG. 4. In this embodiment, each of the pads 61 has an edge formed in an arc shape. In this application, "having an edge formed in an arc shape" refers to, for example, a case in which a portion of the pad 61 other than a portion connected to the wire 62 has an edge formed in an arc shape. However, in this application, "having an edge formed in an arc shape" is not limited to the above example, and may also apply to a case in which, in addition to the portion of the pad 61 connected to the wire 62, another portion has an exterior other than an arc.

In this embodiment, the opening 91 is circular and is larger than the pad 61. In this application, "the opening is larger than the pad" means, for example, that a diameter of the opening 91 is larger than a diameter of the pad 61 (a radius of the opening 91 is larger than a radius of curvature of the arc portion of the pad 61).

In this embodiment, the plurality of pads 61 include a first pad 61A, a second pad 61B, a third pad 61C, a fourth pad 61D, a fifth pad 61E, and a sixth pad 61F. The first pad 61A, the third pad 61C, and the fifth pad 61E are arranged in this order in the +Y direction. The second pad 61B is located on the +X direction side (the center side of the electronic component 30) of the first pad 61A. The fourth pad 61D is located on the +X direction side (the center side of the electronic component 30) of the third pad 61C. The sixth pad 61F is located on the +X direction side (the center side of the electronic component 30) of the fifth pad 61E.

The plurality of wires 62 include a first wire 62A, a second wire 62B, a third wire 62C, a fourth wire 62D, a fifth wire 62E, and a sixth wire 62F. The first wire 62A is connected to the first pad 61A. The second wire 62B is connected to the second pad 61B. The third wire 62C is connected to the third pad 61C. The fourth wire 62D is connected to the fourth pad 61D. The fifth wire 62E is connected to the fifth pad 61E. The sixth wire 62F is connected to the sixth pad 61F.

The plurality of openings 91 include a first opening 91A, a second opening 91B, a third opening 91C, a fourth opening 91D, a fifth opening 91E, and a sixth opening 91F. The first opening 91A is provided corresponding to the first pad 61A, and the first opening 91A exposes the first pad 61A to the outside. The second opening 91B is provided corresponding to the second pad 61B, and the second opening 91B exposes the second pad 61B to the outside. The third opening 91C is provided corresponding to the third pad 61C, and the third opening 91C exposes the third pad 61C to the outside. The fourth opening 91D is provided corresponding to the fourth pad 61D, and the fourth opening 91D exposes the fourth pad 61D to the outside. The fifth opening 91E is provided corresponding to the fifth pad 61E, and the fifth opening 91E exposes the fifth pad 61E to the outside. The sixth opening 91F is provided corresponding to the sixth pad 61F, and the sixth opening 91F exposes the sixth pad 61F to the outside.

\<3.1 Structure of First Wire\>

Next, a structure of the first wire 62A will be described. The first wire 62A includes, for example, a line portion 71 and a connection portion 72.

The line portion 71 extends linearly. For example, the line portion 71 extends linearly in the X direction. In this application, "extending linearly" is not limited to extending linearly, but may also apply to extending curvedly.

The connection portion 72 is provided between the line portion 71 and the first pad 61A, and the connection portion 72 connects the line portion 71 and the first pad 61A. A width of at least a part of the connection portion 72 (for example, a width in the Y direction) is larger than a width of the line portion 71 (for example, a width in the Y direction). In this embodiment, the connection portion 72 includes a first portion 81, a second portion 82, and a third portion 83.

The first portion 81 is connected to the first pad 61A inside the first opening 91A. The first portion 81 extends in a first direction from the first pad 61A. For example, the first direction is a radial direction of the first pad 61A (a radial direction starting from a center C of the first pad 61A). For example, when a virtual line that connects the above-described line portion 71 and the first pad 61A at the shortest distance is defined as a first virtual line V1, the first direction is inclined toward the −Y direction side (the first side) with respect to the first virtual line V1. For example, the first portion 81 extends linearly along a center line C1 extending in the first direction from the center C of the first pad 61A. For example, the first portion 81 extends to be inclined at an angle of 30 degrees to the first side with respect to the first virtual line V1. The first virtual line V1 may be referred to as a "first reference line."

The second portion 82 is connected to the first pad 61A at a position away from the first portion 81 in a circumferential direction of the first pad 61A. The circumferential direction means a direction along the circumference of a circle. The second portion 82 is connected to the first pad 61A inside the first opening 91A. The second portion 82 extends from the first pad 61A in a second direction different from the first direction. The second direction is a direction in which a distance from the first portion 81 increases as a distance from the first pad 61A increases. For example, the second direction is the radial direction of the first pad 61A (the radial direction starting from the center C of the first pad 61A). For example, the second direction is inclined to the +Y direction side (the second side opposite to the first side) with respect to the first virtual line V1. For example, the second portion 82 extends linearly along a center line C2 extending in the second direction from the center C of the first pad 61A. For example, the second portion 82 extends to be inclined at an angle of 30 degrees to the second side with respect to the first virtual line V1. In other words, an angle between the center line C1 and the center line C2 is 60 degrees. The second virtual line V2 may be referred to as a "second reference line."

In this embodiment, in the circumferential direction of the first pad 61A, there is a gap S1 in which no conductive portion is present between the first portion 81 and the second portion 82. A part of the gap S1 is located inside the first opening 91A. In accordance with a joined state of the joint 34 described above, a part of the joint 34 may be present in the gap S1. Further, in this embodiment, a gap S2 is present between the first pad 61A and an opening edge of the first opening 91A, except for a region in which the connection portion 72 is present.

The third portion 83 is located on the side opposite to the first pad 61A with respect to the first portion 81 and the second portion 82. The third portion 83 includes a wide portion spanning the first portion 81 and the second portion 82 in the circumferential direction of the first pad 61A. The third portion 83 is connected to the first portion 81 and the second portion 82. The gap S1 formed between the first portion 81 and the second portion 82 is present between the third portion 83 and the first pad 61A. A width (for example, a width in the Y direction) of the third portion 83 becomes narrower as it is away from the first pad 61A. The third portion 83 is disposed between the line portion 71 and the first portion 81 and the second portion 82. The third portion 83 is connected to the line portion 71.

In this embodiment, the first wire 62A is connected to the first pad 61A within an angular range R of 90 degrees in the circumferential direction of the first pad 61A. In this application, "a wire is connected to a pad within an angular range of 90 degrees in the circumferential direction of the pad" means that an angle between center lines of two portions located at both outermost end portions in the circumferential direction is 90 degrees or less, when the wire has a plurality of portions (for example, the first portion 81 and the second portion 82) extending in different directions. For example, as shown in FIG. 5, for the first wire 62A, the angle between the center line C1 of the first portion 81 and the center line C2 of the second portion 82 is 90 degrees or less.

In this application, "a wire is connected to a pad within an angular range of 90 degrees in the circumferential direction of the pad" may also corresponds to a case in which a part of each of two portions located at both end portions exceeds the angular range R of 90 degrees, when the angle between the center lines of the two portions located at the both end portions is 90 degrees or less. A specific example of this case will be described in detail in a first modified example (refer to FIG. 6) which will be described below. The above definition also applies when the angular range R is less than 90 degrees.

In this embodiment, more specifically, the first wire 62A is connected to the first pad 61A within an angular range R of 60 degrees in the circumferential direction of the first pad 61A. That is, the angle between the center line C1 of the first portion 81 and the center line C2 of the second portion 82 is 60 degrees or less.

<3.2 Structure of Second Wire>

The second wire 62B includes, for example, a line portion 71 and a connection portion 72, like the first wire 62A. The connection portion 72 of the second wire 62B includes a first portion 81, a second portion 82, and a third portion 83, similarly to the connection portion 72 of the first wire 62A. Details of the second wire 62B other than those described below are the same as those of the first wire 62A described above. That is, for details of the second wire 62B, in the above description of the first wire 62A, the "first pad 61A" may be replaced with the "second pad 61B," the "first wire 62A" may be replaced with "second wire 62B," the "first opening 91A" may be replaced with the "second opening 91B," the "first direction" may be replaced with the "third direction," and the "second direction" may be replaced with the "fourth direction."

In this embodiment, the line portion 71 of the second wire 62B and the second pad 61B are not arranged in the X direction. The line portion 71 of the second wire 62B extends between the first wire 62A and the third wire 62C, and also extends near the second pad 61B through between the first pad 61A and the third pad 61C. The line portion 71 of the second wire 62B is positioned in the side opposite to the second pad 61B with respect to the third portion 83 of the second wire 62B. The line portion 71 of the first wire 62A and the line portion 71 of the second wire 62B extend at least partially in parallel.

When a virtual line that connects the second pad 61B and the line portion 71 of the second wire 62B at the shortest distance is defined as the second virtual line V2, the second virtual line V2 extends in a direction that intersects the first virtual line V1 in an XY plane. The "XY plane" is a plane parallel to the X direction and the Y direction. For example, an angle between the first virtual line V1 and the second virtual line V2 is 45 degrees. That is, in this embodiment, a direction in which the connection portion 72 of the first wire 62A and the first pad 61A are arranged is different from a direction in which the connection portion 72 of the second wire 62B and the second pad 61B are arranged.

In this embodiment, the first portion 81 of the second wire 62B extends from the second pad 61B in a third direction. The third direction is a direction different from the first direction. For example, the third direction is a radial direction of the second pad 61B (a radial direction starting from the center C of the second pad 61B). For example, the third direction is inclined to one side with respect to the second virtual line V2. For example, the first portion 81 of the second wire 62B extends linearly along a center line C3 extending from the center C of the second pad 61B in the third direction. For example, the first portion 81 of the second wire 62B extends to be inclined at an angle of 30 degrees with respect to the second virtual line V2.

The second portion 82 of the second wire 62B extends from the second pad 61B in a fourth direction. The fourth direction is different from the second direction and also different from the third direction. The fourth direction is a direction in which a distance from the first portion 81 of the second wire 62B increases as a distance from the second pad 61B increases. For example, the fourth direction is the radial direction of the second pad 61B (the radial direction starting from the center C of the second pad 61B). For example, the fourth direction is inclined on the side opposite to the third direction with respect to the second virtual line V2. For example, the second portion 82 of the second wire 62B extends linearly along a center line C4 extending from the center C of the second pad 61B in the fourth direction. For example, the second portion 82 of the second wire 62B extends to be inclined at an angle of 30 degrees with respect to the second virtual line V2.

In this embodiment, the second wire 62B is connected to the second pad 61B within an angular range R of 90 degrees in the circumferential direction of the second pad 61B. That is, in the second wire 62B, an angle between a center line C3 of the first portion 81 and a center line C4 of the second portion 82 is 90 degrees or less (more specifically, 60 degrees or less).

<3.3 Structure of Third to Sixth Wires>

Each of the third wire 62C and the fifth wire 62E has the same configuration as the first wire 62A described above. On the other hand, each of the fourth wire 62D and the sixth wire 62F has the same configuration as the second wire 62B described above. For example, the line portion 71 of the fourth wire 62D extends between the third wire 62C and the fifth wire 62E, and also extends near the fourth pad 61D through between the third pad 61C and the fifth pad 61E.

4. Operation

Next, an operation of the structure of this embodiment will be described.

As shown in FIG. 5, each of the joints 34 of the electronic component 30 is heated, for example, in a reflow process, and thus changes into a shape that follows an exterior of the pad 61. In this embodiment, a part of the joint 34 is present along the first portion 81 of the connection portion 72 and is in contact with the opening edge of the opening 91. Further, another part of the joint 34 is present along the second portion 82 of the connection portion 72 and is in contact with the opening edge of the opening 91. Thus, stress acting on each of the joints 34 is dispersed in a plurality of directions.

In this embodiment, the joint 34 joined to each of the first pad 61A, the third pad 61C, and the fifth pad 61E is in contact with the opening edge of the opening 91 on the first portion 81 and the second portion 82, and disperses stress in the first direction and the second direction. On the other hand, the joint 34 joined to each of the second pad 61B, the fourth pad 61D, and the sixth pad 61F is in contact with the opening edge of the opening 91 on the first portion 81 and the second portion 82, and disperses stress in the third direction and the fourth direction. Thus, stress can be dispersed in more directions (the first to fourth directions) in the electronic component 30 as a whole.

5. Advantages

In the semiconductor storage device, stress acts between the pads of the printed circuit board and the joints of the electronic component due to expansion and contraction caused by a temperature difference in a usage environment and a vibration impact. In recent years, in the semiconductor storage device, for miniaturization of products and increased density of mounted components, a distance between electronic components mounted on printed circuit board and a distance between electronic components and a fixing part (a restraint part) that fixes the printed circuit board to the housing are becoming narrower. This makes the semiconductor storage device more susceptible to stress caused by the expansion and contraction of the printed circuit board and the vibration impact.

Therefore, in this embodiment, the wiring pattern 52 includes the first pad 61A and the first wire 62A. The first wire 62A includes a first portion 81, a second portion 82, and a third portion 83. The first portion 81 is connected to the first pad 61A inside the first opening 91A, and the first portion 81 extends in the first direction. The second portion 82 is connected to the first pad 61A inside the first opening 91A, and the second portion 82 extends in the second direction in which a distance from the first portion 81 increases as a distance from the first pad 61A increases. The third portion 83 is positioned in the side opposite to the first pad 61A with respect to the first portion 81 and the second portion 82, and is connected to the first portion 81 and the second portion 82. The first wire 62A is connected to the first pad 61A within an angular range R of 90 degrees in the circumferential direction of the first pad 61A.

According to such a configuration, stress acting on each of the joints 34 can be dispersed in a plurality of directions as described above. Thus, defects are less likely to occur in the joints 34 and the board 21, and it is possible to improve joining reliability of the joints 34. As a result, reliability of the semiconductor storage device 1 can be improved. Further, in this embodiment, the first wire 62A is connected to the first pad 61A within the angular range R of 90 degrees. According to such a configuration, the plurality of pads 61 and the plurality of wires 62 can be easily disposed at a high density while the structure in which stress acting on the joint 34 is dispersed in a plurality of directions is realized. Thus, miniaturization of the semiconductor storage device 1 can be achieved.

In this embodiment, the gap S1 is present between the first portion 81 and the second portion 82 in the circumferential direction of the first pad 61A. According to such a configuration, since the first portion 81 and the second portion 82 are independently in contact with the opening edge of the first opening 91A, stress is further easily dispersed in the first direction and the second direction.

In this embodiment, the second portion 82 is connected to the first pad 61A at a position at which it is apart from the first portion 81 in the circumferential direction of the first pad 61A. According to such a configuration, since the first portion 81 and the second portion 82 are located far apart from each other, stress is further easily dispersed in the first direction and the second direction.

In this embodiment, the first wire 62A is connected to the first pad 61A within the angular range R of 60 degrees with respect to the circumferential direction of the first pad 61A. According to such a configuration, the plurality of pads 61 and the plurality of wires 62 can be easily disposed at a higher density while the structure in which stress acting on the joint 34 is dispersed in a plurality of directions is realized. Thus, further miniaturization of the semiconductor storage device 1 can be achieved.

In this embodiment, when a virtual line that connects the first pad 61A and the line portion 71 at the shortest distance is defined as the first virtual line V1, the first direction is inclined to a first side with respect to the first virtual line V1, and the second direction is inclined to a second side opposite to the first side with respect to the first virtual line V1.

According to such a configuration, the configuration of the wire 62 can be easily made smaller, while the structure in which stress acting on the joint 34 is dispersed in a plurality of directions is realized. Thus, further miniaturization of the semiconductor storage device 1 can be achieved.

In this embodiment, the first portion 81 of the second wire 62B is connected to the second pad 61B inside the second opening 91B and extends in a third direction different from the first direction. The second portion 82 of the second wire 62B is connected to the second pad 61B inside the second opening 91B and extends in a fourth direction different from the second direction. According to such a configuration, stress acting between the plurality of joints 34 and the board 21 can be dispersed in more directions. Thus, it is possible to further improve the joining reliability of each of the joints 34.

In this embodiment, a direction in which the connection portion 72 of the first wire 62A and the first pad 61A are arranged is different from a direction in which the connection portion 72 of the second wire 62B and the second pad 61B are arranged. The line portion 71 of the first wire 62A and the line portion 71 of the second wire 62B extend at least partially in parallel. According to such a configuration, it is possible to easily draw out the second wire 62B in a direction parallel to the first wire 62A while a high-density arrangement is realized by making the direction in which the connection portion 72 of the first wire 62A and the first pad 61A are arranged different from the direction in which the connection portion 72 of the second wire 62B and the second pad 61B are arranged. Thus, further miniaturization of the semiconductor storage device 1 can be achieved.

6. Modified Example

Next, some modified examples of the first embodiment will be described. In each of the modified examples, the configuration other than those described below is the same as that of the first embodiment.

6.1 First Modified Example

Figure 6:
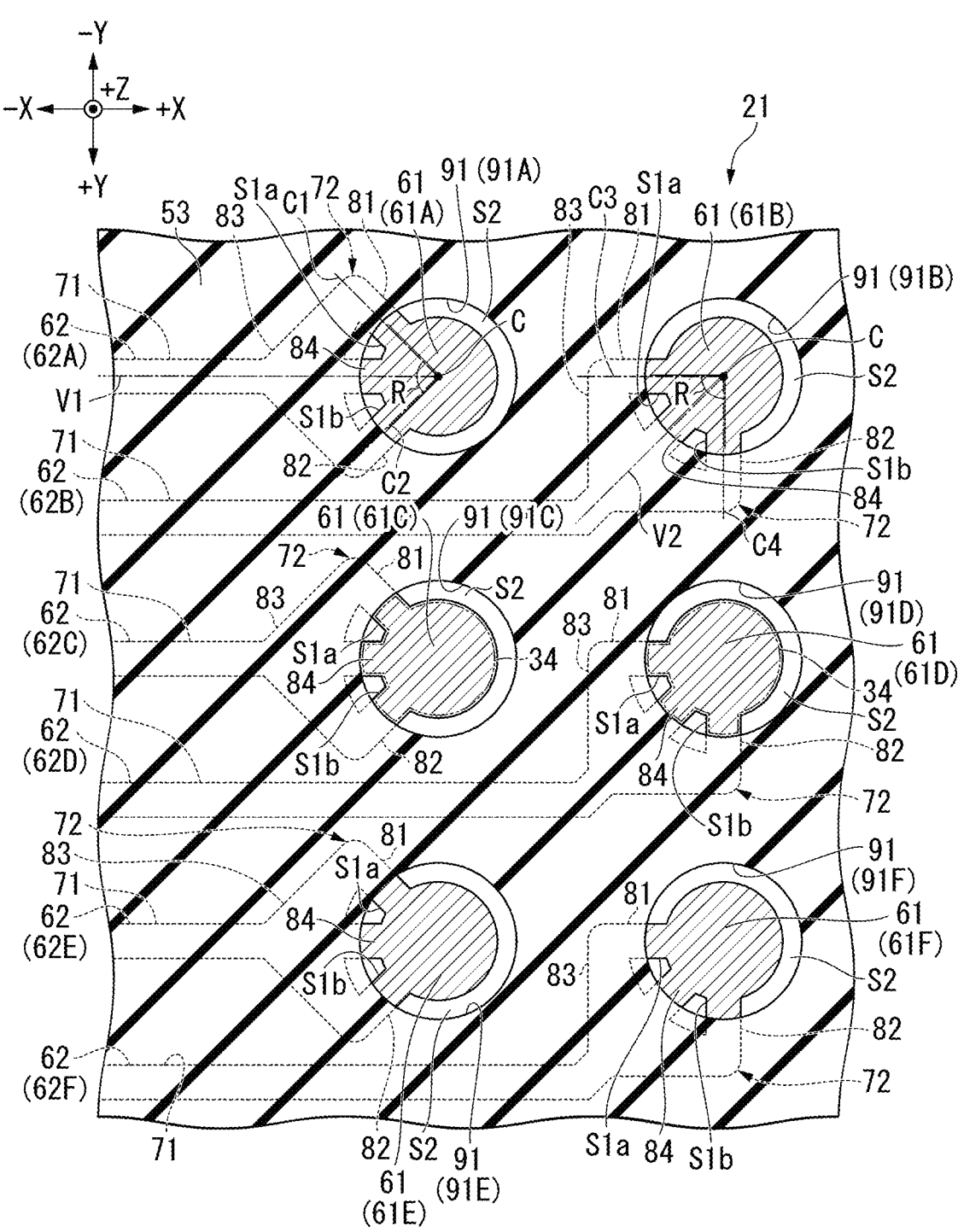
FIG. 6 is a cross-sectional view showing a part of a board according to a first modified example of the first embodiment.

FIG. 6 is a cross-sectional view showing a part of a board 21 according to a first modified example. In this modified example, in each of the first wire 62A, the third wire 62C, and the fifth wire 62E, the angle between the center line C1 of the first portion 81 and the center line C2 of the second portion 82 is 90 degrees. Similarly, in this modified example, in each of the second wire 62B, the fourth wire 62D, and the sixth wire 62F, the angle between the center line C3 of the first portion 81 and the center line C4 of the second portion 82 is 90 degrees.

In this case, in each of the first wire 62A to the sixth wire 62F, a part of each of two portions (the first portion 81 and the second portion 82) located at both end portions of the connection portion 72 exceeds the angular range R of 90 degrees in the circumferential direction of the pad 61. However, as described above, a case in which the angle between the center lines of the two portions located at both end portions is 90 degrees or less corresponds to an example of "a wire is connected to a pad within an angular range of 90 degrees in the circumferential direction of the pad" in this application.

As shown in FIG. 6, in this modified example, the connection portion 72 of each of the wires 62 includes a fourth portion 84 in addition to the first portion 81 to the third portion 83 described above. The fourth portion 84 is provided between the third portion 83 and the pad 61 and is connected to the third portion 83 and the pad 61. The fourth portion 84 is disposed between the first portion 81 and the second portion 82 in the circumferential direction of the pad 61, and the fourth portion 84 is connected to the pad 61 at a different position from the first portion 81 and the second portion 82.

Thus, a gap S1a in which no conductive portion is present is formed between the first portion 81 and the fourth portion 84 in the circumferential direction of the pad 61. Similarly, a gap S1b in which no conductive portion is present is formed between the second portion 82 and the fourth portion 84 in the circumferential direction of the pad 61. A part of each of the gap S1a and the gap S1b is located inside the opening 91.

According to such a configuration, stress acting on each of the joints 34 can be dispersed in three directions. Thus, it is possible to further improve the joining reliability of the joint 34 compared to, for example, the first embodiment.

6.2 Second Modified Example

Figure 7:
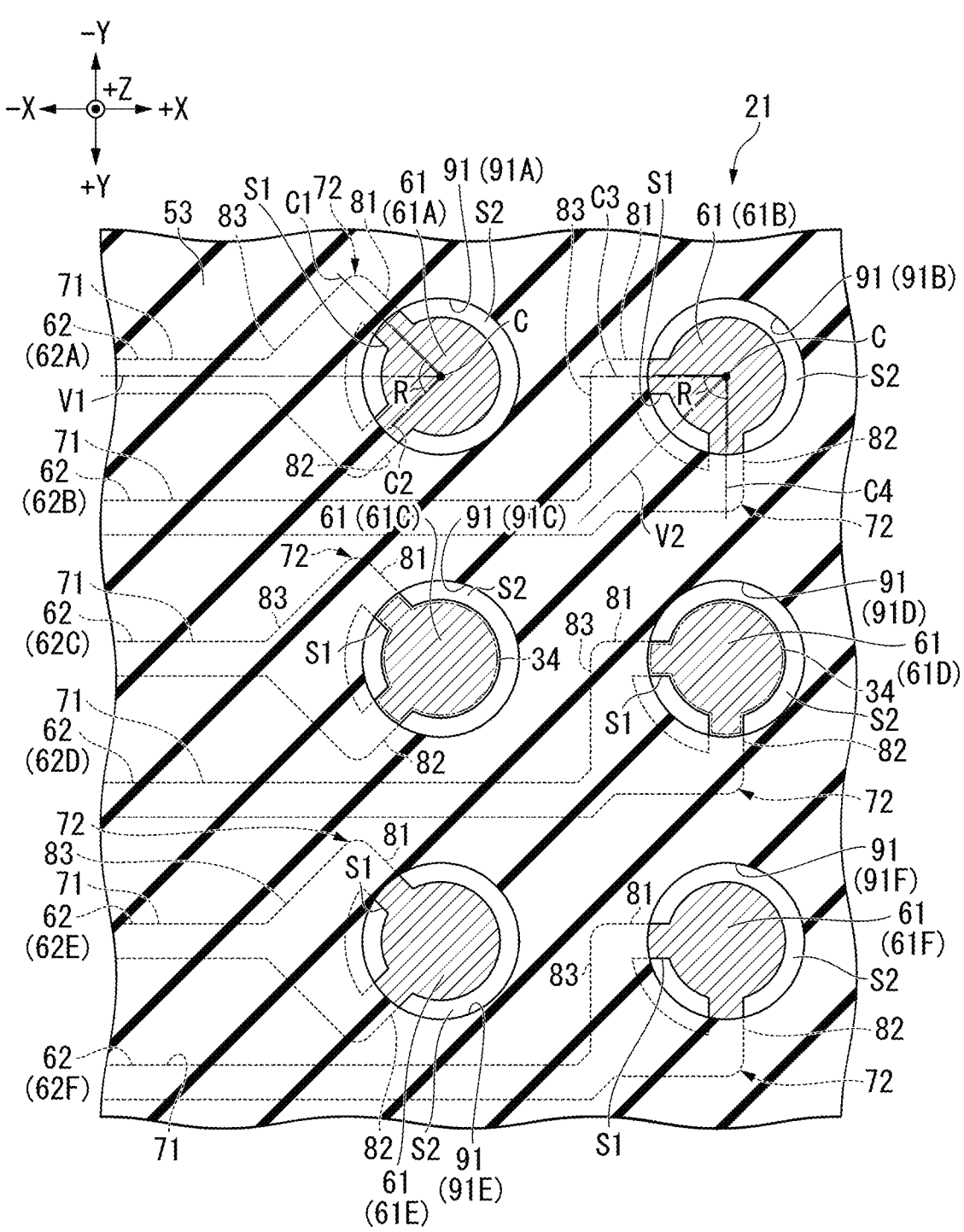
FIG. 7 is a cross-sectional view showing a part of a board according to a second modified example of the first embodiment.

FIG. 7 is a cross-sectional view showing a part of a board 21 according to a second modified example. In this modified example, in each of the first wire 62A, the third wire 62C, and the fifth wire 62E, the angle between the center line C1 of the first portion 81 and the center line C2 of the second portion 82 is 90 degrees. Similarly, in this modified example, in each of the second wire 62B, the fourth wire 62D, and the sixth wire 62F, the angle between the center line C3 of the first portion 81 and the center line C4 of the second portion 82 is 90 degrees.

According to such a configuration, stress acting on each of the joints 34 can be dispersed in two directions that are widely separated from each other. Thus, it is possible to further improve the joining reliability of the joint 34 compared to, for example, the first embodiment.

6.3 Other Modified Examples

Some modified examples have been described above. However, the modified example of the first embodiment is not limited to the above examples. For example, in the first embodiment, the first modified example, and the second modified example, the gaps S1, S1a, and S1b provided in the connection portion 72 may not be present.

Second Embodiment

Next, a second embodiment will be described. The second embodiment is different from the first embodiment in that the opening edge of the opening 91 of the first insulating film 53 has a protruding portion. The configuration other than those described below is the same as the configuration of the first embodiment.

Figure 8:
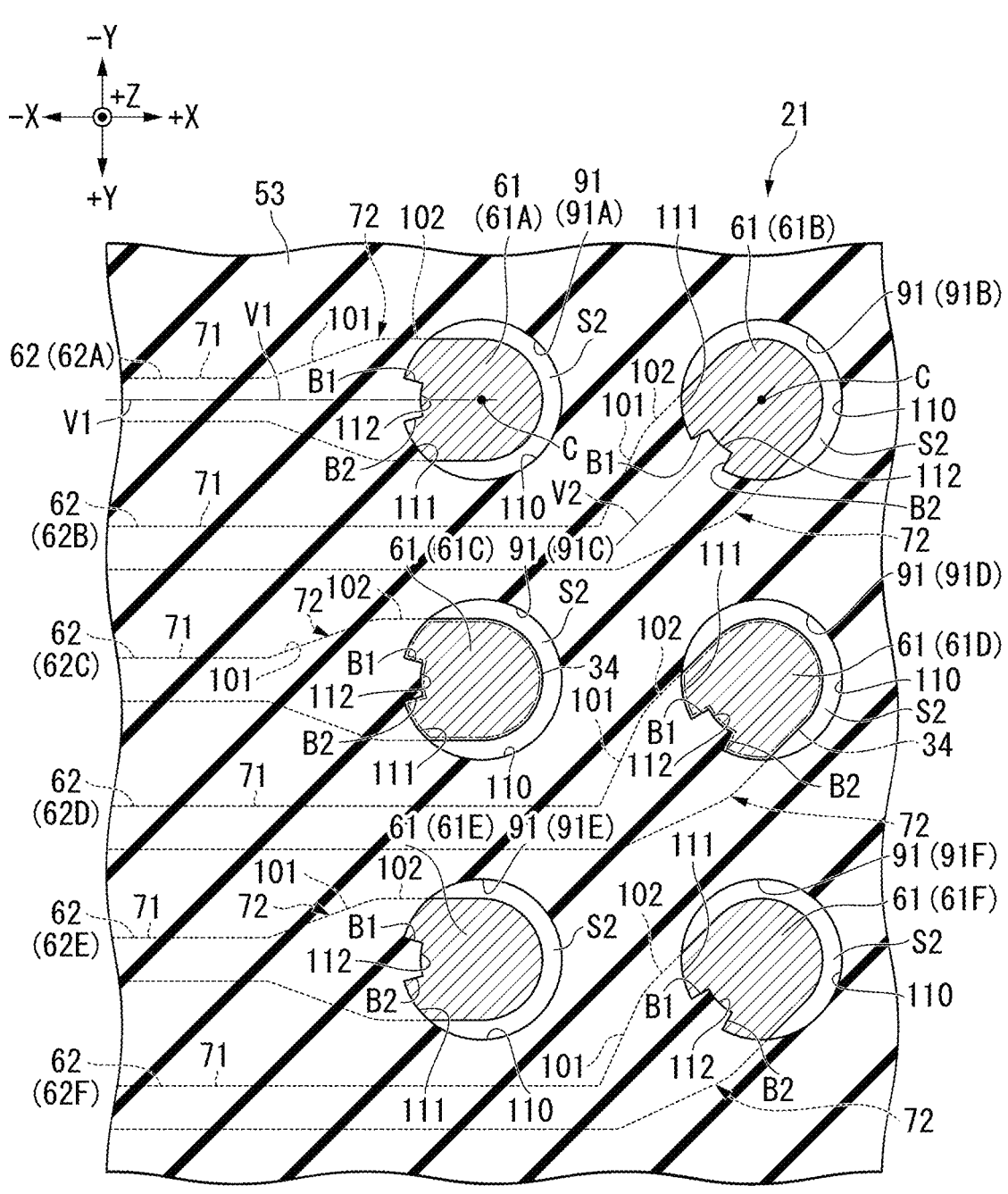
FIG. 8 is a cross-sectional view showing a part of a board according to a second embodiment.

FIG. 8 is a cross-sectional view showing a part of a board 21 according to the second embodiment. In this embodiment, the wiring pattern 52 includes, for example, a plurality of pads 61 (for example, first to sixth pads 61A to 61F) and a plurality of wires 62 (for example, first to sixth wires 62A to 62F).

(Shape of Wire)

The first wire 62A includes, for example, a line portion 71 and a connection portion 72. In this embodiment, the connection portion 72 includes, for example, a first portion 101 and a second portion 102.

A width (for example, a width in the Y direction) of the first portion 101 increases as it approaches the first pad 61A from the line portion 71. The maximum width of the first portion 101 is the same as the maximum width (for example, a diameter) of the first pad 61A.

The second portion 102 is provided between the first portion 101 and the first pad 61A. The second portion 102 has the same width as the maximum width (for example, the diameter) of the first pad 61A over the entire length of the second portion 102, and the second portion 102 connects the first portion 101 and the first pad 61A.

(Shape of Opening)

The first insulating film 53 has a plurality of openings 91 (for example, first to sixth openings 91A to 81F). The first opening 91A is provided corresponding to the first pad 61A, and the first opening 91A is larger than the first pad 61A. An opening edge 110 of the first opening 91A includes a first edge portion 111 and a second edge portion 112.

The first edge portion 111 extends in an arc shape. A radius of curvature of the first edge portion 111 is larger than a radius of the first pad 61A (a radius of curvature of an arc portion of the first pad 61A). In this embodiment, the first edge portion 111 is formed over an angular range of 270 degrees or more in the circumferential direction of the first pad 61A.

The second edge portion 112 is a protruding portion that protrudes from the first edge portion 111 into the first opening 91A. Thus, a first step B1 is present at a boundary between one end of the second edge portion 112 and the first edge portion 111 in the circumferential direction of the first pad 61A. A second step B2 is present at a boundary between the other end of the second edge portion 112 and the first edge portion 111 in the circumferential direction of the first pad 61A. The first step B1 and the second step B2 are steps in an XY plane.

In this embodiment, each of the first step B1 and the second step B2 is along the radial direction of the first pad 61A (the radial direction starting from the center C of the first pad 61A). That is, the first step B1 and the second step B2 are inclined with respect to the first virtual line V1. The second edge portion 112 is provided within an angular range of 90 degrees in the circumferential direction of the first pad 61A. An angle between the first step B1 and the second step B2 is, for example, within 90 degrees. In this embodiment, the angle between the first step B1 and the second step B2 is 30 degrees.

In this embodiment, the first step B1 and the second step B2 are provided at positions overlapping the connection portion 72 of the first wire 62A in the thickness direction of the insulating base material 41 (that is, in the Z direction). That is, the first step B1 and the second step B2 are apart from the gap S2 between the first pad 61A and the opening edge 110 of the first opening 91. In other word, the first step B1 and the second step B2 are provided at positions overlapping the second portion 102 of which a width is widened in the connection portion 72, in the thickness direction of the insulating base material 41.

The connection portion 72 of the second wire 62B includes a first portion 101 and a second portion 102 similarly to the connection portion 72 of the first wire 62A. The second opening 91B includes a first edge portion 111 and a second edge portion 112 similarly to the first opening 91A. Details of the second wire 62B and the second opening 91B other than those described below are the same as the first wire 62A and the first opening 91A described above. That is, for the details of the second wire 62B and the second opening 91B, in the above description of the first wire 62A and the first opening 91A, the "first pad 61A" may be replaced with the "second pad 61B," the "first wire 62A" replaced with the "second wire 62A"

may be replaced with the "second wire 62B," and the "first opening 91A" may be replaced with the "second opening 91B."

In this embodiment, the line portion 71 of the second wire 62B and the second pad 61B are not arranged in the X direction. The line portion 71 of the second wire 62B extends between the first wire 62A and the third wire 62C and also extends near the second pad 61B through between the first pad 61A and the third pad 61C. The line portion 71 of the second wire 62B is positioned in the side opposite to the second pad 61B with respect to the connection portion 72 of the second wire 62B. The line portion 71 of the first wire 62A and the line portion 71 of the second wire 62B extend at least partially in parallel.

In this embodiment, the second virtual line V2 extends in a direction that intersects the first virtual line V1. For example, an angle between the first virtual line V1 and the second virtual line V2 is 45 degrees. That is, in this embodiment, a direction in which the connection portion 72 of the first wire 62A and the first pad 61A are arranged is different from a direction in which the connection portion 72 of the second wire 62B and the second pad 61B are arranged.

Each of the third wire 62C and the fifth wire 62E has the same configuration as the first wire 62A described above. Each of the third opening 91C and the fifth opening 91E has the same configuration as the first opening 91A described above. On the other hand, each of the fourth wire 62D and the sixth wire 62F has the same configuration as the second wire 62B described above. Each of the fourth opening 91D and the sixth opening 91F has the same configuration as the second opening 91B described above.

(Operation)

In this embodiment, the joint 34 is in contact with a part of the first edge portion 111 of the opening 91 and is also in contact with the first step B1 and the second step B2 of the opening 91. Thus, stress acting on the joint 34 is dispersed in a plurality of directions.

(Advantage)

In this embodiment, the opening edge 110 of the first opening 91A has a first edge portion 111 and a second edge portion 112 that protrudes inside the first opening 91A with respect to the first edge portion 111. A boundary (for example, the step B1) between the first edge portion 111 and the second edge portion 112 is provided at a position overlapping the connection portion 72 of the wire 62 in the thickness direction of the insulating base material 41. According to such a configuration, for example, even when the first insulating film 53 is misaligned during manufacturing, the boundary (for example, the step B1) between the first edge portion 111 and the second edge portion 112 tends to remain on the connection portion 72. Therefore, even when the first insulating film 53 is misaligned during manufacturing, for example, the joint 34 can be in contact with the boundary between the first edge portion 111 and the second edge portion 112, and stress acting on the joint 34 can be dispersed in a plurality of directions. Thus, it is possible to improve the joining reliability of the joint 34. As a result, reliability of the semiconductor storage device 1 can be improved.

Modified Example

Next, a modified example of the second embodiment will be described. The configuration of this modified example other than those described below is the same as the configuration of the second embodiment.

Figure 9:
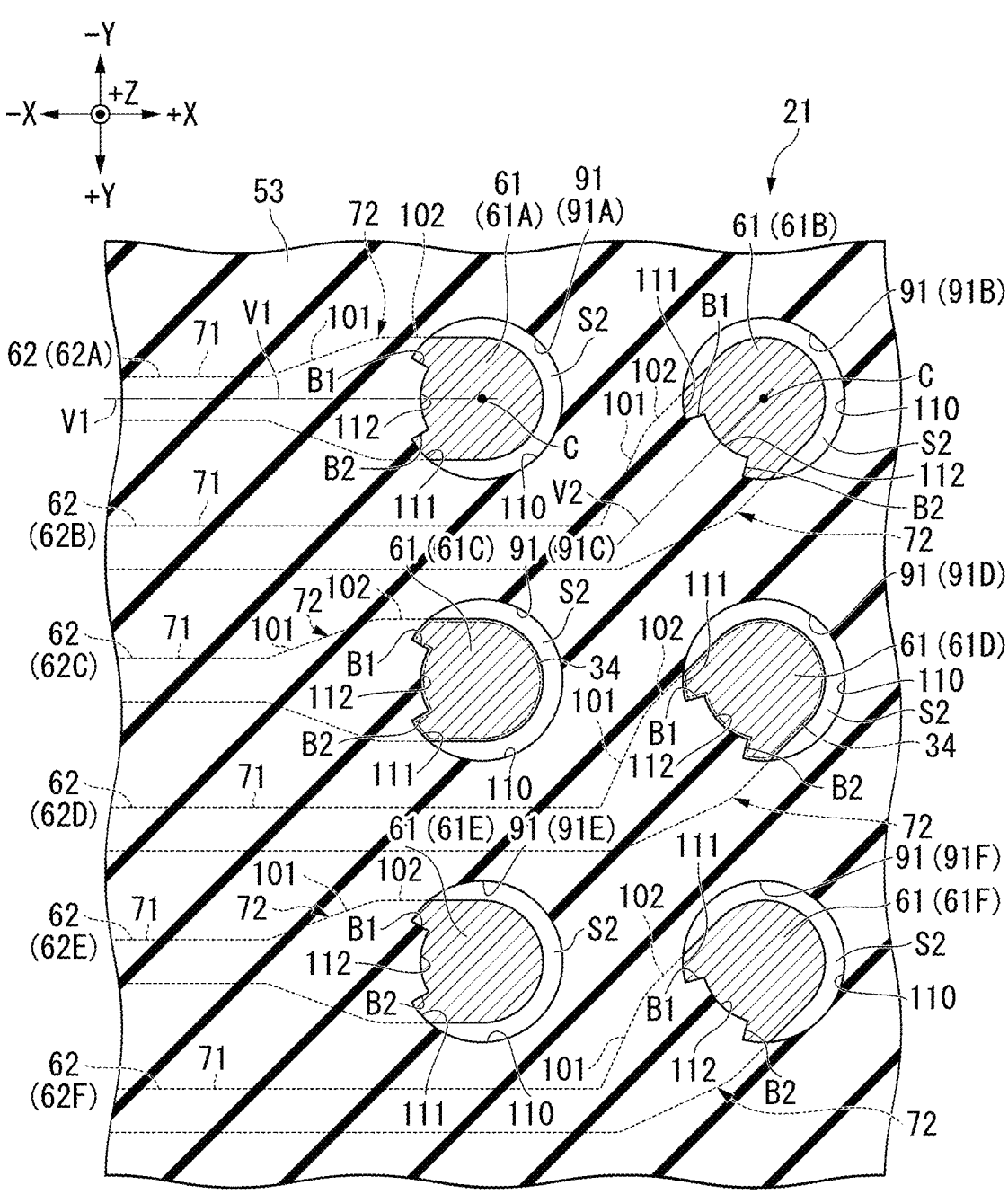
FIG. 9 is a cross-sectional view showing a part of a board according to a modified example of the second embodiment.

FIG. 9 is a cross-sectional view showing a part of a board 21 according to a modified example of the second embodiment. In this embodiment, the angle between the first step B1 and the second step B2 is 45 degrees. According to such a configuration, stress acting on each of the joints 34 can be dispersed in a plurality of directions widely separated from each other. Thus, it is possible to further improve the joining reliability of the joint 34 compared to, for example, the second embodiment.

Third Embodiment

Next, a third embodiment will be described. The third embodiment is different from the second embodiment in that the first step B1 and the second step B2 of the opening 91 of the first insulating film 53 are provided at positions deviated from the connection portion 72. The configuration other than those described below is the same as the configuration of the second embodiment.

Figure 10:
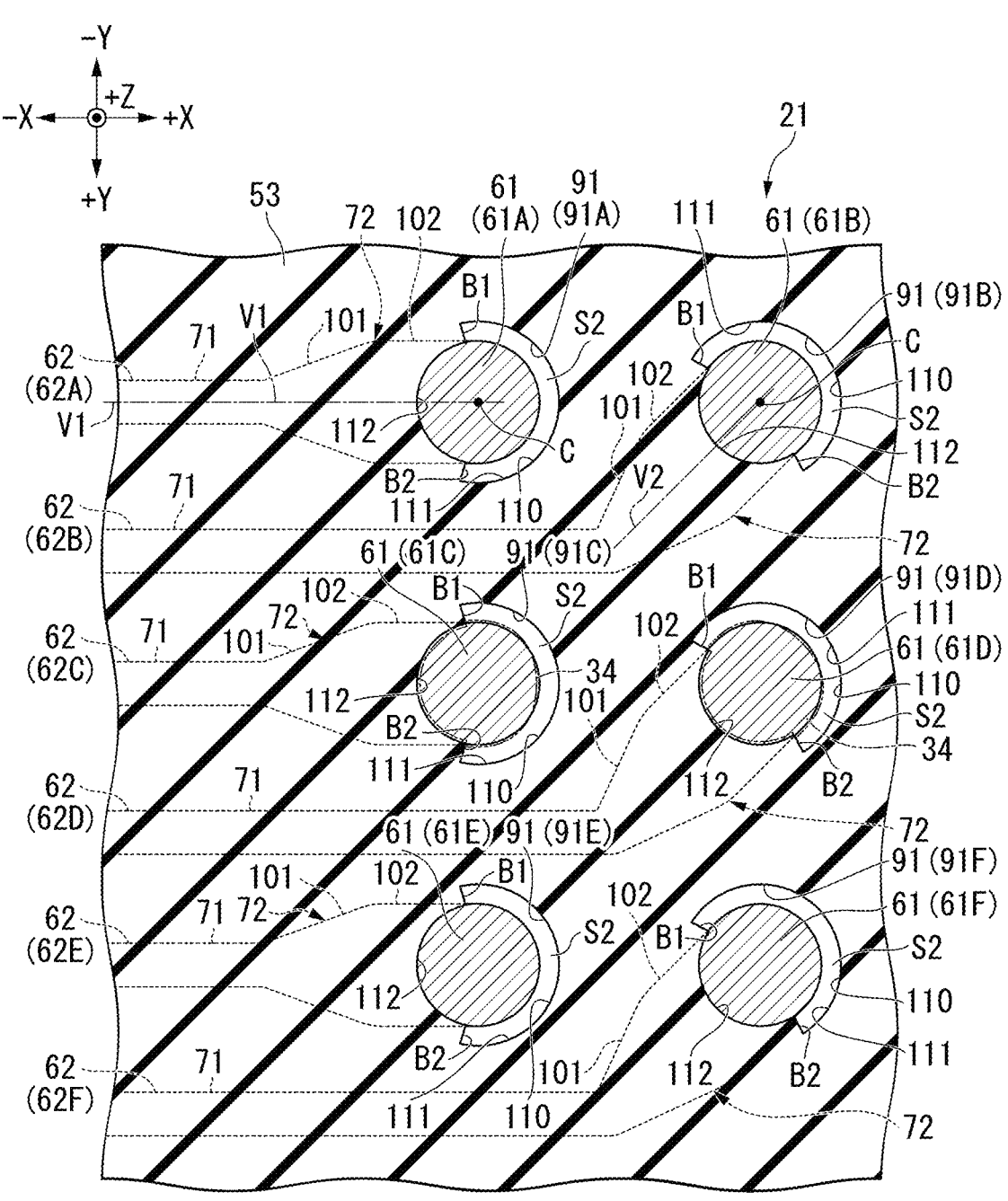
FIG. 10 is a cross-sectional view showing a part of a board according to a third embodiment.

FIG. 10 is a cross-sectional view showing a part of the board 21 according to the second embodiment. In this embodiment, in the thickness direction of the insulating base material 41, each of the first step B1 and the second step B2 is provided at a position deviated from the connection portion 72 and adjacent to the second portion 102 of the connection portion 72.

According to such a configuration, a portion of the joint 34 that swells from the edge of the first pad 61A due to surface tension comes into contact with the first step B1 and the second step B2. Thus, stress acting on the joint 34 is dispersed in a plurality of directions.

In this embodiment, since the first step B1 and the second step B2 are far apart from each other, stress acting on each of the joints 34 can be dispersed at a plurality of positions that are far apart from each other. Thus, it is possible to further improve the joining reliability of the joint 34 compared to, for example, the second embodiment.

Fourth Embodiment

Next, a fourth embodiment will be described. The fourth embodiment is different from the first embodiment in that the wire 62 has a protruding portion. The configuration other than those described below is the same as the configuration of the first embodiment.

Figure 11:
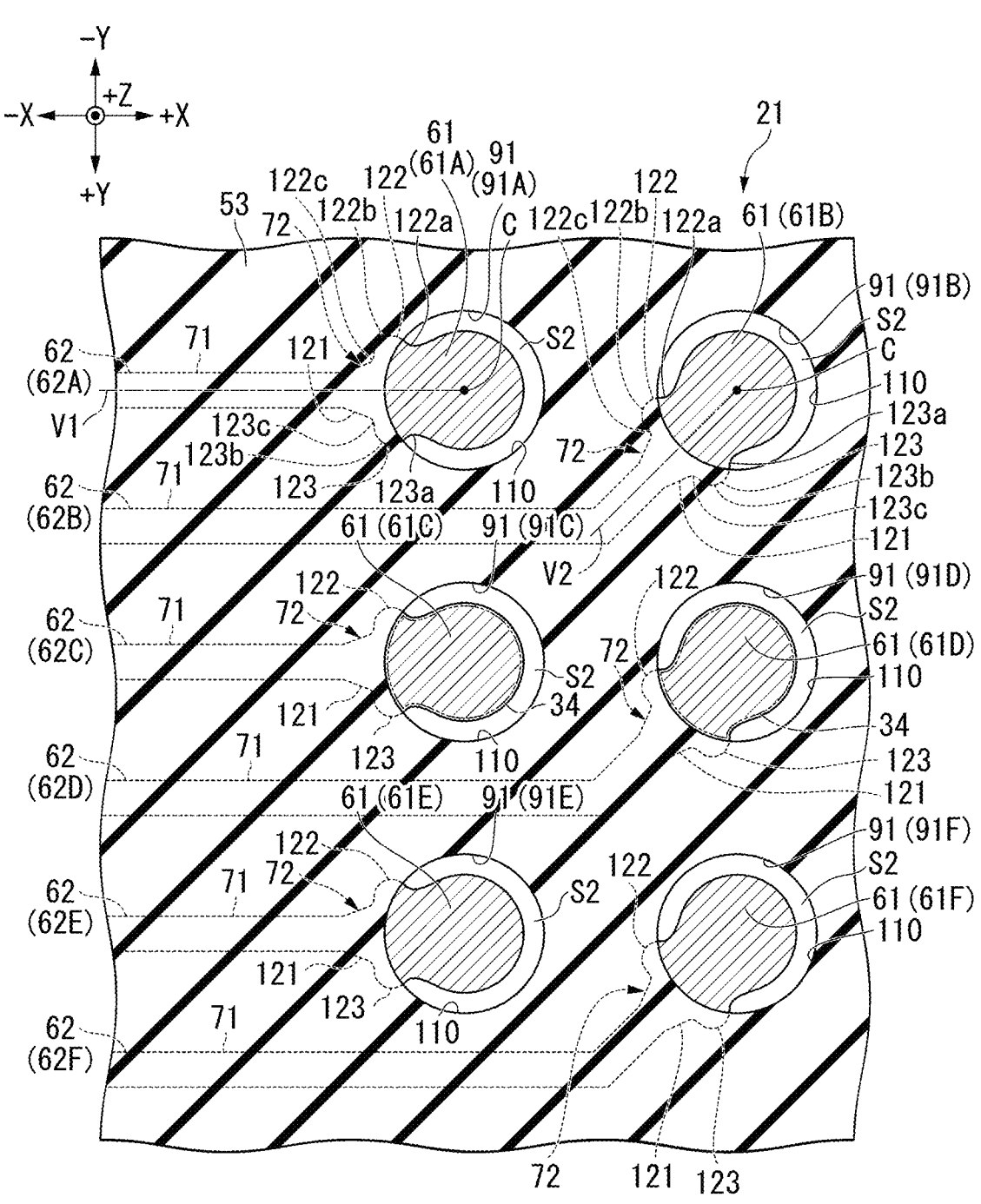
FIG. 11 is a cross-sectional view showing a part of a board according to a fourth embodiment.

FIG. 11 is a cross-sectional view showing a part of a board 21 according to the fourth embodiment. In this embodiment, the first insulating film 53 has a plurality of openings 91 (for example, first to sixth openings 91A to 91B). Each of the openings 91 is circular as in the first embodiment.

The wiring pattern 52 includes, for example, a plurality of pads 61 (for example, first to sixth pads 61A to 61F) and a plurality of wires 62 (for example, first to sixth wires 62A to 62F).

The first wire 62A includes, for example, a line portion 71 and a connection portion 72. In this embodiment, the connection portion 72 includes, for example, a first portion 121, a second portion 122, and a third portion 123.

The first portion 121 is provided between the first pad 61A and the line portion 71. The first portion 121 extends in a first direction from the first pad 61A toward the line portion 71. A width of the first portion 121 decreases as it approaches the line portion 71 from the first pad 61A. The first portion 121 connects the first pad 61A and the line portion 71.

The second portion 122 is provided at a position overlapping the opening edge 110 of the first opening 91A in the thickness direction of the insulating base material 41. The second portion 122 protrudes from the first portion 121 in a second direction that intersects the first direction. An exterior of the second portion 122 is, for example, a semicircular shape that smoothly continues to an exterior of the first portion 121 and is convex in a direction away from the first portion 121. For example, the second portion 122 protrudes in a direction perpendicular to the edge of the first portion 121.

The exterior of the second portion 122 includes, for example, a first curved portion 122a, a second curved portion 122b, and a third curved portion 122c. The first curved portion 122a has an arc shape that smoothly continues to the first portion 121 and of which an inclination with respect to the first portion 121 gradually increases as a distance from the first portion 121 increases. The second curved portion 122b is continuous with the first portion 121. The second curved portion 122b has an arc shape of which an inclination with respect to the first portion 121 gradually decreases as a distance from the first portion 121 increases. The second curved portion 122b forms a top portion (a protruding end) of the second portion 122. The third curved portion 122c is positioned in the side opposite to the first curved portion 122a with respect to the second curved portion 122b. The third curved portion 122c has an arc shape that smoothly continues to the first portion 121 and of which an inclination with respect to the first portion 121 gradually increases as a distance from the first portion 121 increases. The opening edge 110 of the first opening 91A overlaps the first curved portion 122a or the second curved portion 122b in the thickness direction of the insulating base material 41.

The third portion 123 is positioned in the side opposite to the second portion 122 with respect to the first portion 121. The third portion 123 is provided at a position overlapping the opening edge 110 of the first opening 91A in the thickness direction of the insulating base material 41. The third portion 123 protrudes from the first portion 121 in a third direction that intersects the first direction. An exterior of the third portion 123 is, for example, a semicircular shape that smoothly continues to the exterior of the first portion 121 and is convex in a direction away from the first portion 121. For example, the third portion 123 protrudes in a direction perpendicular to the edge of the first portion 121.

The exterior of the third portion 123 includes, for example, a first curved portion 123a, a second curved portion 123b, and a third curved portion 123c. The first curved portion 123a has an arc shape that smoothly continues to the first portion 121 and of which an inclination with respect to the first portion 121 gradually increases as a distance from the first portion 121 increases. The second curved portion 123b is continuous with the first portion 121. The second curved portion 123b has an arc shape of which an inclination with respect to the first portion 121 gradually decreases as a distance from the first portion 121 increases. The second curved portion 123b forms a top (a protruding end) of the third portion 123. The third curved portion 123c is positioned in the side opposite to the first curved portion 122a with respect to the second curved portion 123b. The third curved portion 123c has an arc shape that smoothly continues to the first portion 121 and of which an inclination with respect to the first portion 121 gradually increases as a distance from the first portion 121 increases. The opening edge 110 of the first opening 91A overlaps the first curved portion 123a or the second curved portion 123b in the thickness direction of the insulating base material 41.

The connection portion 72 of the second wire 62B includes a first portion 121, a second portion 122, and a third portion 123, similarly to the connection portion 72 of the first wire 62A. Details of the second wire 62B other than those described below are the same as those of the first wire 62A described above. That is, for details of the second wire 62B, in the above description of the first wire 62A, the "first pad 61A" may be replaced with the "second pad 61B," the "first wire 62A" may be replaced with the "second wire 62B," and the "first opening 91A" may be replaced with the "second opening 91B."

In this embodiment, the line portion 71 of the second wire 62B and the second pad 61B are not arranged in the X direction. The line portion 71 of the second wire 62B extends between the first wire 62A and the third wire 62C and also extends near the second pad 61B through between the first pad 61A and the third pad 61C. The line portion 71 of the second wire 62B is positioned in the side opposite to the second pad 61B with respect to the connection portion 72 of the second wire 62B. The line portion 71 of the first wire 62A and the line portion 71 of the second wire 62B extend at least partially in parallel.

In this embodiment, the second virtual line V2 extends in a direction that intersects the first virtual line V1. For example, the angle between the first virtual line V1 and the second virtual line V2 is 45 degrees. That is, in this embodiment, a direction in which the connection portion 72 of the first wire 62A and the first pad 61A are arranged is different from a direction in which the connection portion 72 of the second wire 62B and the second pad 61B are arranged.

Each of the third wire 62C and the fifth wire 62E has the same configuration as the first wire 62A described above. On the other hand, each of the fourth wire 62D and the sixth wire 62F has the same configuration as the second wire 62B described above.

(Operation)

In this embodiment, a part of the joint 34 is present along the first portion 121 of the connection portion 72 and is in contact with the opening edge 110 of the opening 91. Further, another part of the joint 34 is present along the second portion 122 of the connection portion 72 and is in contact with the opening edge 110 of the opening 91. Thus, stress acting on each of the joints 34 is dispersed in a plurality of directions.

In this embodiment, the joint 34 joined to each of the first pad 61A, the third pad 61C, and the fifth pad 61E is in contact with the opening edge 110 of the opening 91 on the first portion 121 and the second portion 122, and disperses stress in a plurality of directions. On the other hand, the joint 34 joined to each of the second pad 61B, the fourth pad 61D, and the sixth pad 61F is in contact with the opening edge of the opening 91 on the second portion 122 and the third portion 123, and disperses stress in a plurality of directions different from those described above. Thus, stress can be dispersed in more directions in the electronic component 30 as a whole.

(Advantage)

In this embodiment, the first wire 62A includes a line portion 71 and a connection portion 72 provided between the line portion 71 and the first pad 61A. The connection portion 72 includes a first portion 121 of which a width decreases as it approaches the line portion 71 from the first pad 61A, and a second portion 122. The second portion 122 is provided at a position overlapping with the opening edge 110 of the first opening 91A in the thickness direction of the insulating base material 51, and protrudes from the first portion 121 in a second direction intersecting the first direction.

According to such a configuration, stress acting on each of the joints 34 can be dispersed in a plurality of directions as described above. Thus, defects are less likely to occur in the joints 34 and the board 21, and it is possible to improve the joining reliability of the joints 34. As a result, the reliability of the semiconductor storage device 1 can be improved.

In this embodiment, an exterior of the second portion 122 includes a curved portion 122*a* of which an inclination with respect to the first portion 121 gradually increases as a distance from the first portion 121 increases. According to such a configuration, the joint 34 melted in a reflow process easily enters the second portion 122 from the first portion 121. Further according to such a configuration, a direction in which the opening edge 110 of the first opening 91A and the second portion 122 are in contact with each other tends to be largely different from a direction in which the opening edge 110 of the first opening 91A and the third portion 123 are in contact with each other. Therefore, stress acting on each of the joints 34 can be dispersed in two directions widely separated from each other. Thus, it is possible to further improve the joining reliability of the joint 34 compared to, for example, the first embodiment.

Fifth Embodiment

Next, a fifth embodiment will be described. The fifth embodiment is different from the first embodiment in that the reinforcing structure described above is applied to a back surface of a package type semiconductor storage device. The configuration other than those described below is the same as the configuration of the first embodiment.

Figure 12:
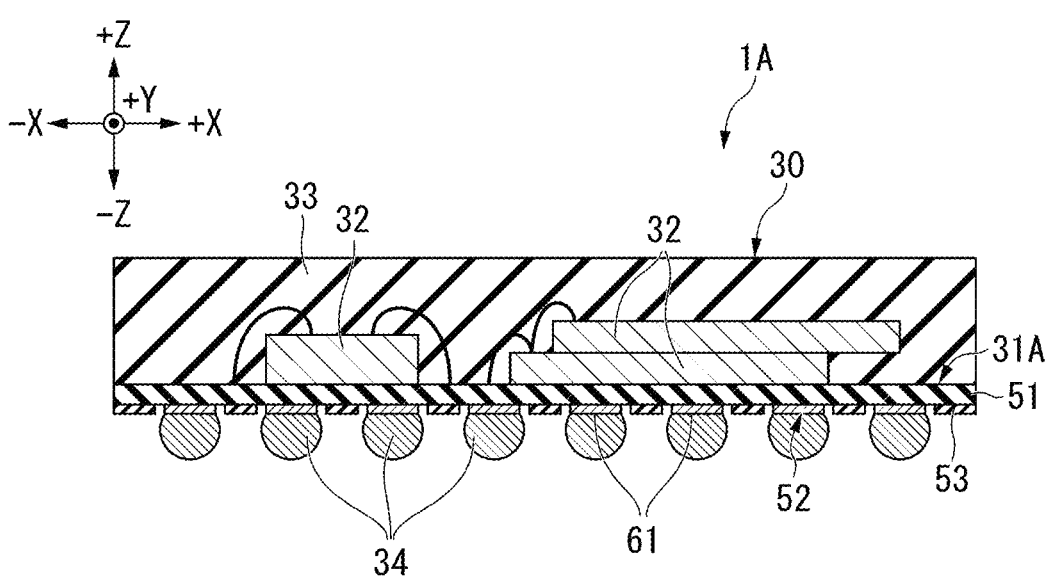
FIG. 12 is a cross-sectional view showing a semiconductor storage device according to a fifth embodiment.

FIG. 12 is a cross-sectional view showing a package type semiconductor storage device 1A. The semiconductor storage device 1A includes a package board 31A, a circuit chip 32, a sealing resin part 33, and a plurality of joints 34.

The package board 31A is a board that becomes a base of the semiconductor storage device 1A. The package board 31A is a printed wiring board. The package board 31A has a plate shape following the X direction and the Y direction. The package board 31A includes, for example, an insulating base material 51, a wiring pattern 52, and an insulating film 53. The wiring pattern 52 and the insulating film 53 are provided on a-Z direction side surface of the insulating base material 51. The wiring pattern 52 includes a plurality of pads 61. The first to fourth embodiments and their modified examples described above are applied to the wire 62 of the wiring pattern 52 and/or the opening 91 of the insulating film 53.

According to such a configuration, it is possible to improve the reliability of the semiconductor storage device 1A.

Although several embodiments and modified examples have been described above, the embodiments are not limited to the above examples. For example, the embodiments described above may be implemented in combination with each other.

According to at least one embodiment described above, the first wire of the board has a first portion connected to the first pad inside the first opening and extending in the first direction, and a second portion connected to the first pad inside the first opening and extending in the second direction in which the distance from the first portion increases as the distance from the first pad increases. The first wire is connected to the first pad within the angular range of 90 degrees in the circumferential direction of the first pad. According to such a configuration, the reliability of the semiconductor storage device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:

an insulating base material;

a wiring pattern on the insulating base material;

an insulating film on a surface of the insulating base material, the insulating film covering a part of the wiring pattern; and an electronic component electrically connected to the wiring pattern, wherein the wiring pattern includes a first pad having an edge formed in an arc shape, and a first wire, the insulating film has a first opening larger than the first pad, the first wire has a first portion, a second portion, and a third portion, the first portion being connected to the first pad inside the first opening and the first portion extending in a first direction, the second portion being connected to the first pad inside the first opening and the second portion extending in a second direction, the second portion has a first distance from the first portion and a second distance from the first pad, the first distance increases as the second distance increases, and the third portion being in a side opposite to the first pad with respect to the first portion and the second portion, the third portion being connected to the first portion and the second portion, and the first wire is connected with the first pad in an angular range of not more than 90 degrees in a circumferential direction of the first pad.

2. The semiconductor storage device according to claim 1, wherein a gap is present between the first portion and the second portion in the circumferential direction.

3. The semiconductor storage device according to claim 1, wherein the second portion is connected to the first pad at a position separated from the first portion in the circumferential direction.

4. The semiconductor storage device according to claim 1, wherein the first wire is connected with the first pad in the angular range of not more than 60 degrees in the circumferential direction of the first pad.

5. The semiconductor storage device according to claim 1, wherein the first wire includes a line portion disposed in a side opposite to the first pad with respect to the third portion and the line portion extends linearly, when a virtual line that connects the first pad and the line portion at a shortest distance is defined as a first virtual line, the first direction is inclined to a first side with respect to the first virtual line, and the second direction is inclined to a second side opposite to the first side with respect to the first virtual line.

6. The semiconductor storage device according to claim 1, wherein the wiring pattern further includes a second pad disposed near the first pad and having an edge in an arc shape, and a second wire, the insulating film further has a second opening larger than the second pad, the second wire has a first portion connected to the second pad inside the second opening and the first portion extends in a third direction different from the first direction, the second wire has a second portion connected to the second pad inside the second opening, and the second portion extends in a fourth direction different from the second direction where a distance of the second portion from the first portion of the second wire increases as a distance of the second portion from the second pad increases, and the second wire has a third portion disposed in a side opposite to the second pad with respect to the first portion and the second portion of the second wire and the third portion is connected to the first portion and the second portion of the second wire, and the second wire is connected with the second pad in an angular range of not more than 90 degrees in a circumferential direction of the second pad.

7. The semiconductor storage device according to claim 1, wherein the electronic component has a solder joint connected to the first pad.

8. The semiconductor storage device according to claim 1, wherein the first portion and the second portion are exposed through the first opening.

9. The semiconductor storage device according to claim 1, wherein the electronic component is a semiconductor package.

10. The semiconductor storage device according to claim 6, wherein the first wire includes a first line portion in a side opposite to the first pad with respect to the third portion of the first wire and the first line portion extends linearly, the second wire includes a second line portion in a side opposite to the second pad with respect to the third portion of the second wire and the second line portion extends linearly, and the first line portion and the second line portion extends at least in part in parallel to each other.

* * * * *